(12) United States Patent
Jayaraman et al.

(10) Patent No.: US 6,341,137 B1
(45) Date of Patent: Jan. 22, 2002

(54) WAVELENGTH DIVISION MULTIPLEXED ARRAY OF LONG-WAVELENGTH VERTICAL CAVITY LASERS

(75) Inventors: Vijaysekhar Jayaraman, Goleta; Jonathan Geske; Frank Peters, both of Lompoc, all of CA (US)

(73) Assignee: Gore Enterprise Holdings, Inc., Newark, DE (US)

( * ) Notice: Subject to any disclaimer, the term of this patent is extended or adjusted under 35 U.S.C. 154(b) by 0 days.

(21) Appl. No.: 09/300,252

(22) Filed: Apr. 27, 1999

(51) Int. Cl.[7] .................................................. H01S 5/00
(52) U.S. Cl. ........................................... 372/50; 372/23
(58) Field of Search ...................................... 372/23, 50

(56) References Cited

U.S. PATENT DOCUMENTS

| | | | |
|---|---|---|---|
| 5,029,176 A | 7/1991 | Chang-Hasnain | 372/50 |
| 5,291,502 A | 3/1994 | Pezeshki et al. | 372/20 |
| 5,422,898 A | 6/1995 | Kash et al. | 372/23 |
| 5,436,759 A | 7/1995 | Dijaili et al. | 359/333 |
| 5,491,710 A | 2/1996 | Lo | 372/45 |
| 5,513,204 A | 4/1996 | Jayaraman | 372/96 |
| 5,532,856 A | 7/1996 | Li et al. | 359/118 |
| 5,546,209 A | 8/1996 | Willner et al. | 259/115 |
| 5,650,612 A | 7/1997 | Criswell et al. | 250/226 |
| 5,661,577 A | 8/1997 | Jenkins et al. | 359/11 |
| 5,684,308 A | 11/1997 | Lovejoy et al. | 257/184 |
| 5,754,578 A | 5/1998 | Jayaraman | 372/50 |
| 5,760,419 A | 6/1998 | Nabiev et al. | 257/21 |
| 5,768,002 A | 6/1998 | Puzey | 359/245 |
| 5,780,867 A | 7/1998 | Fritz et al. | 257/13 |
| 5,835,517 A | 11/1998 | Jayaraman et al. | 372/50 |
| 5,886,809 A | 3/1999 | Puzey | 359/278 |
| 5,912,751 A | 6/1999 | Ford et al. | 359/128 |
| 5,914,976 A | 6/1999 | Jayaraman et al. | 372/50 |

FOREIGN PATENT DOCUMENTS

| | | |
|---|---|---|
| WO | 97/42665 | 5/1996 |
| WO | 98/48492 | 4/1997 |

OTHER PUBLICATIONS

Fiore A et al. Multiple-wavelength vertical-cavity laser arrays based on postgrowth lateral-vertical oxidation of AlGaAs. Applied Physics Letters 1998; 73(3) 282–284.

Imada M et al. Distributed feedback surface-emitting laser with air/semiconductor gratings embedded by mass-transport assisted wafer fusion technique, IEEE Photonics Technology Letters 1997; 9(4) 419–421.

Primary Examiner—Teresa A. Arroyo
Assistant Examiner—Davienne Monbleau
(74) Attorney, Agent, or Firm—Vic Genco; Eric Sheets

(57) ABSTRACT

A semiconductor device includes an array of long-wavelength VCSELs pumped by a short-wavelength optical pump. The array of long-wavelength VCSELs includes a series of semiconductor recesses, where each semiconductor recess is between two layers of a VCSEL, substantially overlapping the transverse model profile of the VCSEL under operation.

2 Claims, 6 Drawing Sheets

US 6,341,137 B1

WAVELENGTH DIVISION MULTIPLEXED ARRAY OF LONG-WAVELENGTH VERTICAL CAVITY LASERS

BACKGROUND OF THE INVENTION

1. Field of the Invention

This invention relates to a semiconductor device that includes an array of long-wavelength vertical cavity lasers.

2. Description of the Related Art

A vertical cavity surface emitting laser (VCSEL) is a semiconductor laser including a semiconductor layer of optically active material, such as gallium arsenide or indium phosphide. The optically active material is sandwiched between mirrors formed of highly reflective layers of metallic material, dielectric material, or epitaxially-grown semiconductor material. Conventionally, one of the mirrors is partially reflective so as to pass a portion of the coherent light which builds up in a resonating cavity formed by the mirrors sandwiching the active layer.

Lasing structures require optical confinement in the resonating cavity and carrier confinement in the active region to achieve efficient conversion of pumping electrons into stimulated photons through population inversion. The standing wave of reflected optical energy in the resonating cavity has a characteristic cross-section giving rise to an optical mode. A desirable optical mode is the single fundamental transverse mode, for example, the $HE_{11}$ mode of a cylindrical waveguide. A single mode signal from a VCSEL is easily coupled into an optical fiber, has low divergence, and is inherently single frequency in operation.

In order to reach the threshold for lasing, the total gain of a VCSEL must equal the total loss of the VCSEL. Unfortunately, due to the compact nature of VCSELs, the amount of gain media is limited. For efficient VCSELs, at least one of the two required mirrors must have a reflectivity greater than approximately 99.5%. It is more difficult to meet this requirement in long-wavelength VCSELs than in short-wavelength VCSELs because such high reflectivity mirrors are difficult to grow in the same epitaxial step as the long-wavelength active region. Because epitaxially-grown mirrors often do not enable sufficiently high reflectivity, some VCSELs are formed by wafer fusing the top and bottom mirrors to the active region.

Wafer fusion is a process by which materials of different lattice constant are atomically joined by applying pressure and heat to create a real physical bond. Thus, wafer fusion of one or both of the mirrors to the active region is used to increase the reflectivity provided by either or both of the mirrors to compensate for the small amount of gain media so that the lasing threshold can be reached and maintained.

A long-wavelength VCSEL can be optically coupled to and optically pumped by a shorter wavelength, electrically pumped VCSEL. U.S. Pat. No. 5,513,204 to Jayaraman entitled "LONG WAVELENGTH, VERTICAL CAVITY SURFACE EMITTING LASER WITH VERTICALLY INTEGRATED OPTICAL PUMP" describes an example of a short-wavelength VCSEL optically pumping a long-wavelength VCSEL.

Various schemes have been proposed to make wavelength-division-multiplexed (WDM) arrays of vertical cavity surface emitting lasers (VCSELs) monolithically on a single substrate. One technique introduces temperature gradients across the wafer during epitaxial growth in order to change growth rate and lasing wavelength across the wafer. In another approach, the bottom mirror and active region of the VCSEL are grown first. The active region is then etched different amounts in different areas, after which the top mirror is re-grown to complete the wavelength-stepped VCSEL array. Another technique takes advantage of the wavelength dependence on size, to create an array of different sized devices which have different wavelengths. Still another approach uses a tapered thickness oxidation layer to shift wavelength different amounts at different parts of the taper.

All of these schemes have been applied to short-wavelength (e.g., 850 nm or 980 nm) VCSELs. Work in WDM arrays of long-wavelength (e.g., 1300 nm or 1550 nm) VCSELs has progressed more slowly, however.

FIG. 1 illustrates the making of a double-fused WDM array. A 1550 nm active region 10 has been wafer-fused to a first GaAs/AlGaAs mirror 12. A stepped surface 14 is formed (e.g., by etching) in the top surface of the active region 10. A second GaAs/AlGaAs mirror 16 is subsequently fused to the active region 10. The presence of the stepped surface 14 complicates the wafer fusion, which requires nominally planar surfaces to work with high yield.

The physics of wafer fusion to a stepped surface are not well-understood, but probably involve mass transport which planarizes the surface being fused during fusion. This leads to uncertainty in the ultimate wavelength of the fused device. It also makes it difficult to create large wavelength steps for wide channel spacing systems, since this requires deep etches which may not fully planarize, leading to a poor quality bond.

SUMMARY OF THE INVENTION

A semiconductor device includes a wavelength-division-multiplexed (WDM) array of long-wavelength vertical cavity lasers. Each vertical cavity laser includes at least one wafer-fused interface and a buried semiconductor recess adjacent the wafer-fused interface. In an exemplary embodiment, the long-wavelength vertical cavity laser is a vertical cavity surface emitting laser (VCSEL) that includes a wafer-fused interface and a buried semiconductor recess disposed at the wafer-fused interface. The buried semiconductor recess substantially overlaps a transverse modal profile of the VCSEL.

A first portion of the VCSEL is provided on a first wafer. A second portion of the VCSEL is provided on a second wafer. At least one recess is etched in one of the first or second portions. The first and second wafers are bonded such that the buried semiconductor recess is formed in a location that will substantially overlap a transverse modal profile of the VCSEL in operation.

Other features and advantages of the invention will become apparent from the following detailed description, taken in conjunction with the accompanying drawing, which illustrate, by way of example, the features of the invention.

DETAILED DESCRIPTION

In this description, "top" or "upper" are relative terms referring to regions of the semiconductor device away from the substrate, and "bottom" and "lower" mean toward the substrate.

As the term is used herein, "semiconductor recess" shall mean a region of a semiconductor material wherein a portion of the semiconductor material has been removed; said region may be filled with an additional material.

Figure 1:
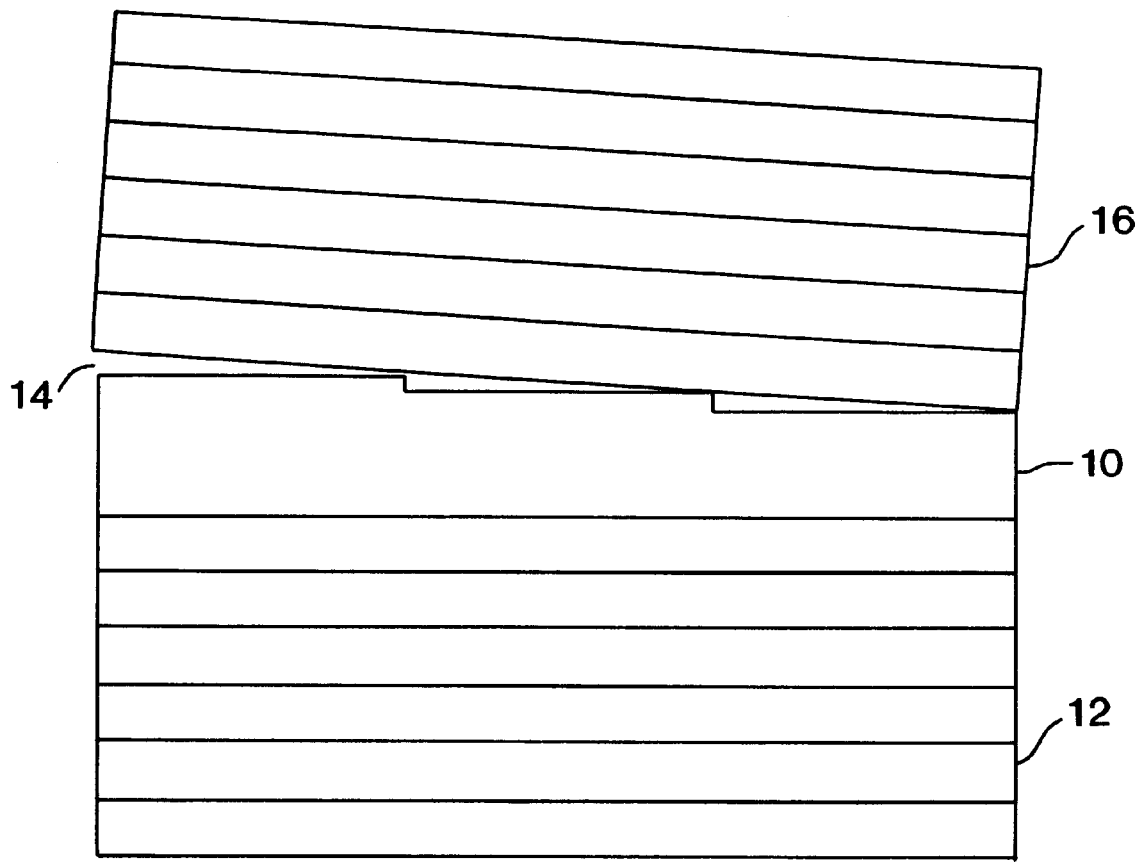
FIG. 1 illustrates a conventional array of vertical cavity lasers.
Figure 2:
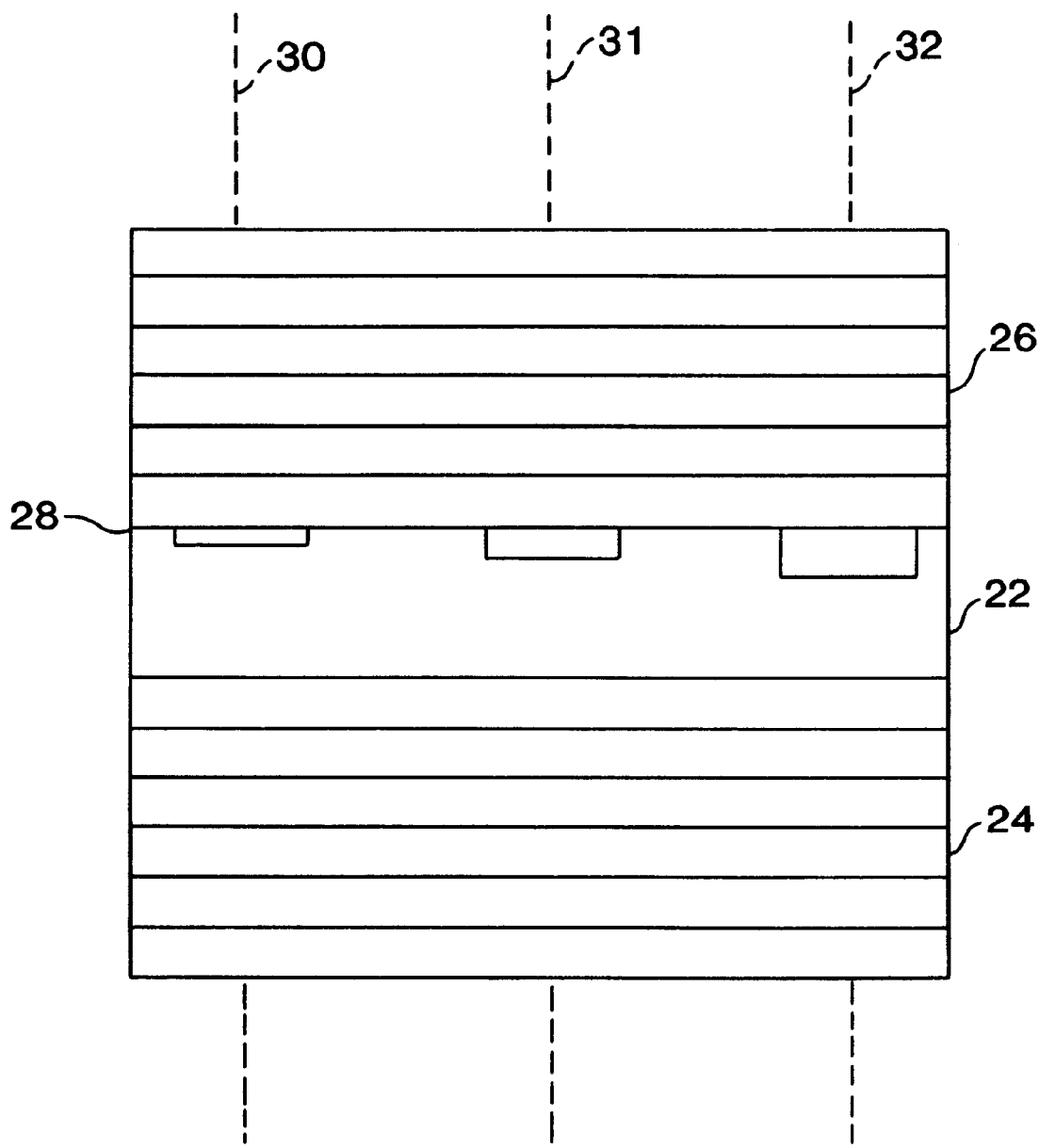
FIG. 2 illustrates a portion of a semiconductor device made in accordance with the principles of the invention.

A portion of a semiconductor device is illustrated in FIG. 2. A 1550 nm active region 22 has been fused to a first GaAs/AlGaAs mirror 24. The active region includes a plurality of superlattice layers. A series of recessed depths is formed (e.g., by etching) in the top surface of the active region. The recessed depths have different depth levels. A second GaAs/AlGaAs mirror 26 is wafer-fused to the active region 22, thereby enclosing the recessed depths and creating a series of buried semiconductor recesses having different depth levels adjacent the wafer-fused interface 28 defined by the active region 22 and the second GaAs/AlGaAs mirror 26.

In the portion of the semiconductor device illustrated in FIG. 2, the double-fused WDM array of long-wavelength VCSELs includes three adjacent VCSELs, each with a central vertical axis 30, 31, 32. Each VCSEL, the position of which is identified in FIG. 2 by its respective central vertical axis, includes a portion of the second mirror 26 and a portion of the first mirror 24 sandwiching the active region 22.

The thin precision semiconductor recesses of varying depth that are defined between the wafer-fused interface 28 and the active region 22 have been etched into the superlattice layers of the active region prior to creation of the wafer-fused interface 28. The depth of each buried semiconductor recess measured from the wafer-fused interface determines the lasing wavelength of the respective VCSEL.

Each semiconductor recess extends radially outward from the central vertical axis 30, 31, 32 of its respective VCSEL slightly past the optical mode field of the VCSEL. Because the semiconductor recess only extends radially outward from the central vertical axis to slightly past the optical mode field, the bulk of the top surface of the active region 22 available to be fused is planar, which leads to high-yield wafer fusion and a predictable output wavelength. In accordance with the principles of the invention, all the required fusions in the wafer-fused long-wavelength VCSEL arrays occur on nominally planar surfaces.

An array of VCSELs according to the invention can be directly electrically pumped, but that kind of injection scheme can be complicated by the presence of the insulating air-gap formed by the buried semiconductor recess. An integrated optical pump, however, works well with the air-gap inside the device. The energy from the optical pump passes essentially undisturbed through the insulating air-gap. Therefore, it is preferable that the semiconductor device be optically pumped.

Figure 3:
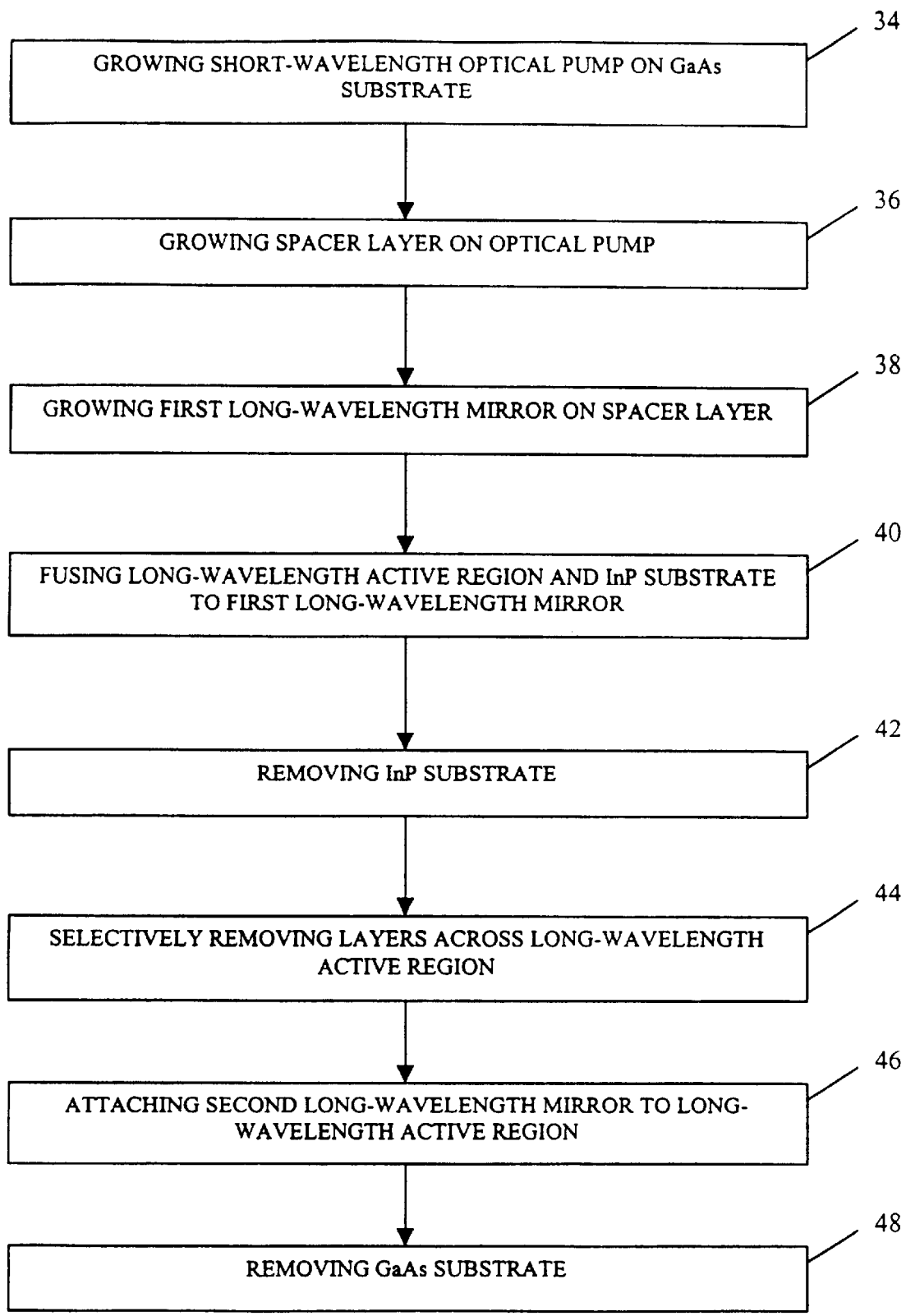
FIG. 3 is a process flow diagram for describing making a semiconductor device in accordance with the principles of the invention.

FIG. 3 is a process flow diagram for describing making a semiconductor device in accordance with the principles of the invention. With reference to FIG. 3, the semiconductor device is made by growing a short-wavelength pump laser on an associated GaAs substrate in step 34. The pump laser includes a p-mirror on the bottom, an active region on top of the p-mirror, and an n-mirror on top of the active region. A spacer layer is grown on top of the n-mirror in step 36. A first ungraded and undoped 1300 nm distributed Bragg reflector (DBR) is grown on top of the spacer layer in step 38. An InP-based active region and an associated InP substrate are fused to the first 1300 nm DBR in step 40. The associated InP substrate is removed by chemical etching in step 42. Layers of the InP-based active region are selectively removed at the location of each long-wavelength cavity to shift the wavelength of the finished long-wavelength cavity in step 44. The second ungraded and undoped 1300 nm DBR is attached to the InP-based active region in step 46. The GaAs substrate associated with the pump laser is removed by chemical etching in step 48.

Figure 4:
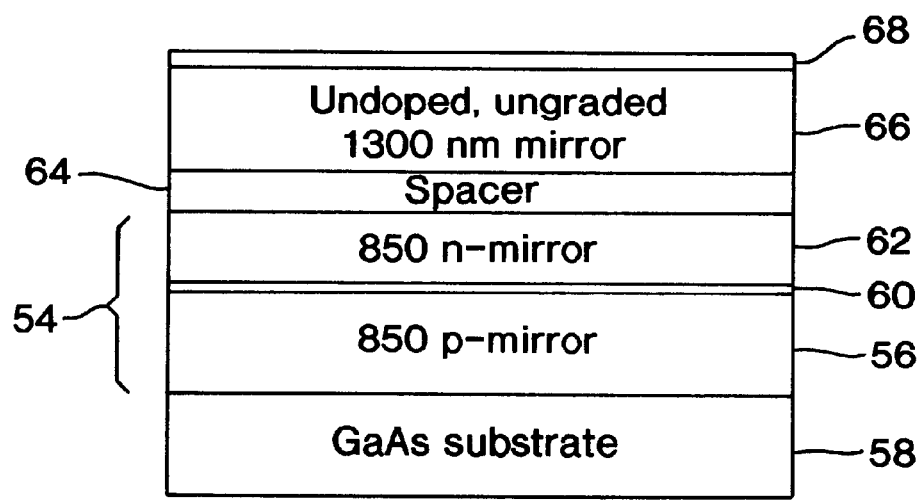
FIGS. 4–6 illustrate a specific embodiment of the process for use in making a semiconductor device in accordance with the principles of the invention.
Figure 5:
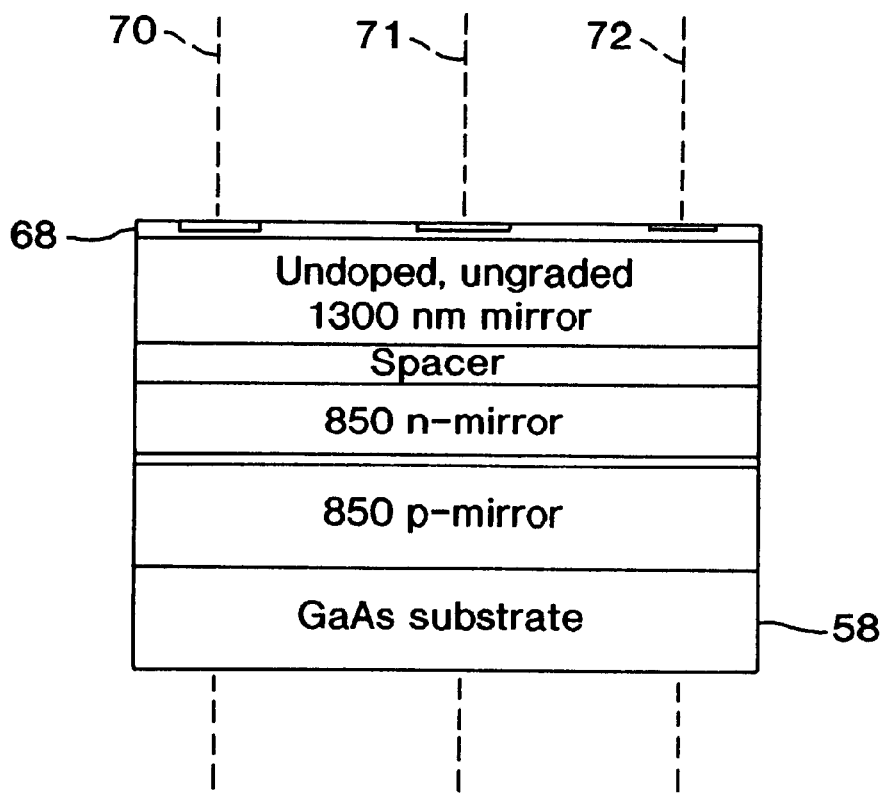
Figure 6:
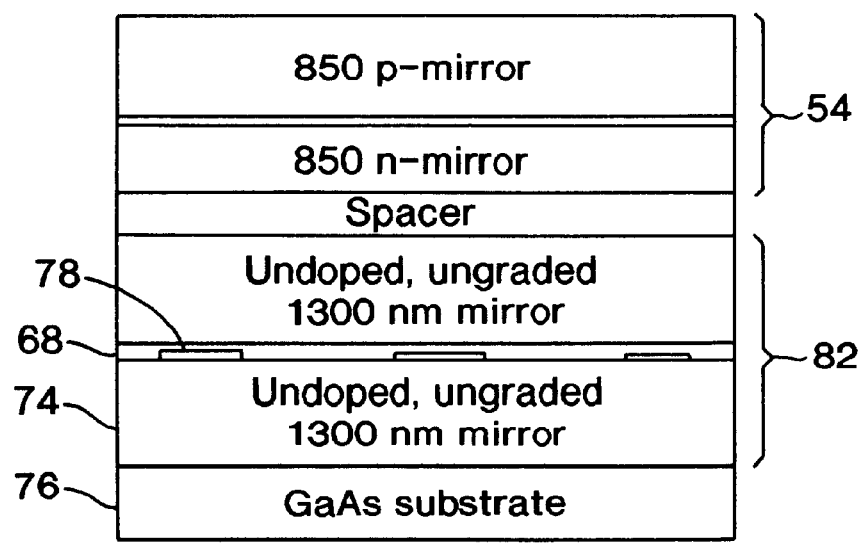

FIGS. 4–6 illustrate a specific embodiment of the process for use in fabricating a semiconductor device in accordance with the principles of the invention. In the specific embodiment, the semiconductor device includes an array of long-wavelength VCSELs and an array of vertically integrated short-wavelength VCSEL pumps. Each short-wavelength VCSEL is electrically pumped to emit short-wavelength laser light. The short-wavelength laser light stimulates the long-wavelength VCSEL to emit long-wavelength laser light.

A first stage in making the semiconductor device is shown in FIG. 4. Referring to FIG. 4, a short-wavelength pump laser 54 is grown in conjunction with one mirror of the long-wavelength cavity. An 850 nm p-mirror 56 is grown on a GaAs substrate 58. An 850 nm active region 60 is grown above the p-mirror 56. An 850 nm n-mirror 62 is grown above the 850 nm active region 60. A spacer layer 64 is grown on top of the n-mirror 62. A first ungraded and undoped 1300 nm distributed Bragg reflector (DBR) 66 is grown above the spacer layer 64. A 1300 nm InP-based active region 68 is fused to the top surface of the 1300 nm DBR 66. An InP substrate (not shown) associated with the 1300 nm InP-based active region 68 is then removed by chemical etching. The top exposed surface of the 1300 nm InP-based active region 68 contains alternating superlattice layers of InP and InGaAsP of precision thickness.

Referring to FIG. 5, across the top of the device at locations corresponding to the long-wavelength cavity of each VCSEL in the array, some of the alternating superlattice layers of InP and In GaAsP are selectively removed from the active region 68 in order to shift the emission wavelength of the long-wavelength cavity in the finished semiconductor device. The layers are removed over an extent measured radially outward from a central vertical axis 70, 71, 72 of each long-wavelength VCSEL in the array that encompasses the optical mode field of the long-wavelength VCSEL, but leaves most of the top surface of the active region 68 planar for fusing in a subsequent wafer fusion step.

Referring to FIG. 6, the InP-based active region 68 is flipped onto a second undoped and ungraded 1300 nm mirror 74 on a GaAs substrate 76 in a second wafer-fusion step. The second wafer fusion-step attaches the InP-based active region 68 to the second ungraded and undoped 1300 nm DBR 74, creating a series of semiconductor recesses 78 defined between the recessed depths etched into the InP-based active region 68 and the fused surface of the second 1300 nm DBR 74.

The GaAs substrate 58 (FIGS. 4 and 5) associated with the pump laser 54 is then removed by chemical etching, leaving a structure with the pump laser 54 on top, emitting downward into the 1300 nm lasers 82, as shown in FIG. 6.

With respect to FIG. 6, the varying levels of the recessed depths are accomplished during the selective removal of different numbers of superlattice layers. Thus, adjacent 1300 nm lasers within the completed semiconductor device have intra-cavity semiconductor recesses of varying depth.

The 1300 nm lasers 82 can emit up through the 850 nm pump laser 54 or down through the GaAs substrate 76. The semiconductor recess is introduced on the high-reflector side of each VCSEL cavity, where it has a minimal effect on the emitted output power. The pump laser 54 emits at 850 nm and the three long-wavelength VCSELs 82 emit near 1300 nm in this specific embodiment, but other wavelength combinations are possible. The pumping wavelength can be within the range from 700 nm to 1050 nm. The emission wavelength can be within the range from 1250 nm to 1650 nm. The completed semiconductor device is illustrated in FIG. 6.

TABLE I illustrates an example of the etch depths required for a four-channel four-VCSEL system using 5-nm spacing:

TABLE I

| Etch Depth (nm) | Delta Etch Depth (nm) | Wavelength (nm) |
| --- | --- | --- |
| 0 | 0 | 1329.84 |
| 53.1 | 53.1 | 1324.79 |
| 69.3 | 16.2 | 1319.91 |
| 82.8 | 13.5 | 1314.74 |

The etch depths in the four VCSELs used in the example are: 0, 531 Angstroms (Å), 693 Å, and 828 Å. This is referred to as coarse WDM (CWDM). The etch-depth tolerance can be greatly relaxed by placing the semiconductor recesses near a null in the optical standing wave, as illustrated in TABLE I.

If the desired wavelength accuracy is 10% of the channel spacing, or 0.5 nm for the 5 nm-spaced system, the worst-case etch tolerance (for the 828 Å etch) is ±10 Å. This corresponds to slightly worse than 1% control of the superlattice layers grown to make the active region, which can be routinely achieved using modern epitaxial growth techniques.

Figure 7:
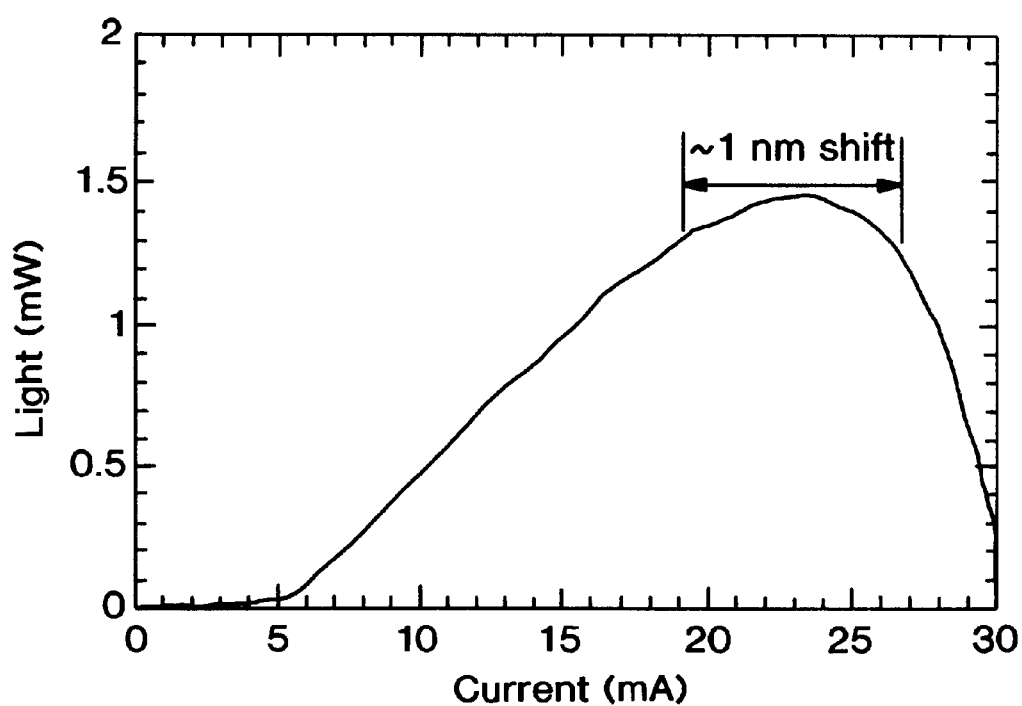
FIG. 7 is a plot of the relationship between output power and bias current in a specific embodiment of a semiconductor device in accordance with the principles of the invention.

VCSELs allow "wavelength trimming" by adjustment of the bias current, without changing the output power appreciably. Such trimming can be accomplished by adjusting the bias current near rollover, as shown in FIG. 7. The wavelength shift caused by changing the bias current is used to trim output lasing wavelength.

Etch depth errors can cause errors in lasing wavelength. Increasing the bias current from 19 mA to 27 mA, which corresponds to a power variation of only ±10% as shown in FIG. 7, results in a 1 nm shift in output wavelength. Therefore, several tenths of a nanometer error in output wavelength caused by errors in etch depth can be compensated by increasing the bias current a few mA. Edge emitters do not have this feature.

The wavelength shift caused by changing the bias current can also be used to realize an "extremely dense WDM" (EDWDM) system, with channel spacing of 0.1 nm. Referring to FIG. 7, the WDM array can operate at eleven different bias currents over the range from 19 mA to 27 mA, giving a total spread of 1 nm and a channel spacing of 0.1 nm. This kind of a system requires no semiconductor recesses inside the optical cavity and can be made from a uniform array of VCSELs.

Figure 8:
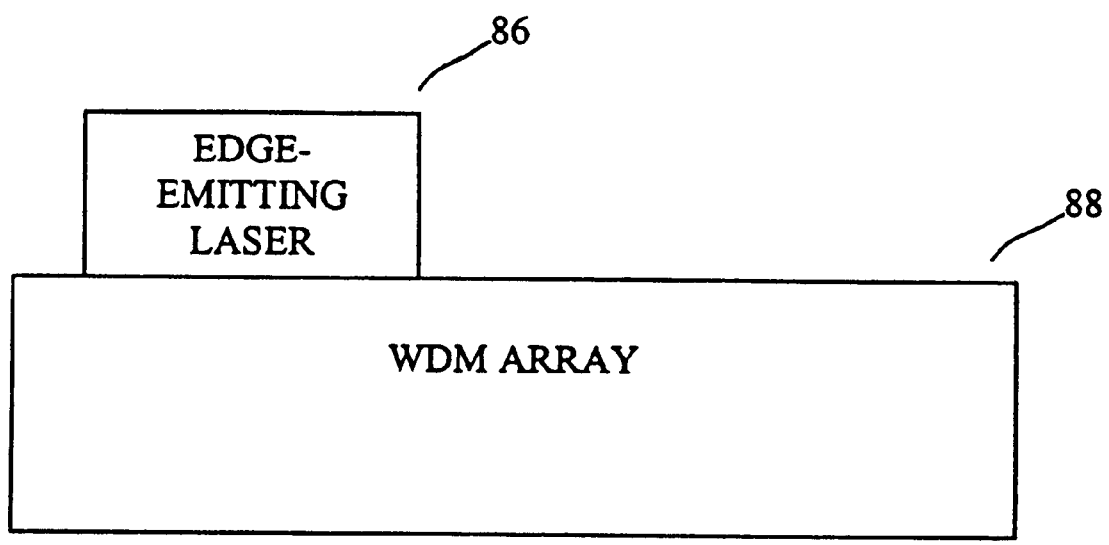
FIG. 8 illustrates an edge-emitting laser optically pumping a WDM array.

An optically pumped WDM array created using etched semiconductor recesses at the wafer-fused interface in accordance with the principles of the invention does not need to be pumped by a vertically integrated short-wavelength VCSEL. Alternatively, a single edge-emitter that is edge-coupled into one of the mirrors of the array can pump all the long-wavelength VCSELs in the array. The edge-pumping approach can be used irrespective of the type of WDM array. The individual lasers can then be modulated externally. FIG. 8 schematically illustrates an edge-emitting laser 86 optically pumping a WDM array 88.

While several particular forms of the invention have been illustrated and described, it will also be apparent that various modifications can be made without departing from the spirit and scope of the invention.

What is claimed is:

1. An array of vertical cavity surface emitting lasers (VCSELs) comprising: at least two VCSELs each having an epitaxial structure, wherein the epitaxial structure of each VCSEL in the array comprises a wafer fused interface and a buried semiconductor recess disposed at the wafer-fused interface, wherein each recess has a different depth to enable each VCSEL to emit at a different wavelength.

2. The array according to claim 1, wherein each of the VCSELs are biased differently.

* * * * *